United States Patent [19]

Brown et al.

[11] 3,846,786

[45] Nov. 5, 1974

[54] HIGH SPEED PARALLEL-CASCADED ANALOG TO DIGITAL CONNECTOR

[75] Inventors: James H. Brown, Severna Park; James E. Buchanan, Bowie; Steven Morrison, Randallstown, all of Md.

[73] Assignee: Westinghouse Electric Corporation, Pittsburgh, Pa.

[22] Filed: Jan. 10, 1973

[21] Appl. No.: 322,350

[52] U.S. Cl. .................... 340/347 AD, 340/347 CC

[51] Int. Cl. .......................................... H03k 13/02

[58] Field of Search .................... 235/150.5, 150.52; 340/347 AD, 347 CC

[56] References Cited

UNITED STATES PATENTS

| | | | |
|---|---|---|---|
| 3,460,122 | 8/1969 | Barber et al. | 340/347 AD |
| 3,521,273 | 7/1970 | Saari | 340/347 AD |
| 3,638,218 | 1/1972 | Kaneko et al. | 340/347 AD |

*Primary Examiner*—Joseph F. Ruggiero
*Attorney, Agent, or Firm*—J. B. Hinson

[57] ABSTRACT

An ultra high speed, parallel-cascaded analog to digital converter employs non-saturating current switches, a constant current source, and a summer for effecting the parallel-cascaded interconnection of two or more parallel A/D converters.

11 Claims, 6 Drawing Figures

| #1MSB | #1NMSB | #1LSB | $E_o$ (VOLTS) |
|---|---|---|---|
| 1 | 1 | 1 | +25 |
| 1 | 1 | 0 | +17 |
| 1 | 0 | 1 | +9 |
| 1 | 0 | 0 | +1 |
| 0 | 1 | 1 | −7 |
| 0 | 1 | 0 | −15 |
| 0 | 0 | 1 | −23 |
| 0 | 0 | 0 | −31 |

TRUTH TABLE OF 3 BIT PARALLEL A/D CONVERTER

| ANALOG INPUT | $C_1$ | $C_2$ | $C_3$ | $C_4$ | $C_5$ | $C_6$ | $C_7$ | MSB | NMSB | LSB |
|---|---|---|---|---|---|---|---|---|---|---|
| 24 < A < 32 | 1 | 1 | 1 | 1 | 1 | 1 | 1 | 1 | 1 | 1 |
| 16 < A < 24 | 0 | 1 | 1 | 1 | 1 | 1 | 1 | 1 | 1 | 0 |
| 8 < A < 16 | 0 | 0 | 1 | 1 | 1 | 1 | 1 | 1 | 0 | 1 |
| 0 < A < 8 | 0 | 0 | 0 | 1 | 1 | 1 | 1 | 1 | 0 | 0 |
| -8 < A < 0 | 0 | 0 | 0 | 0 | 1 | 1 | 1 | 0 | 1 | 1 |
| -16 < A < -8 | 0 | 0 | 0 | 0 | 0 | 1 | 1 | 0 | 1 | 0 |
| -24 < A < -16 | 0 | 0 | 0 | 0 | 0 | 0 | 1 | 0 | 0 | 1 |
| -32 < A < -24 | 0 | 0 | 0 | 0 | 0 | 0 | 0 | 0 | 0 | 0 |

HIGH SPEED PARALLEL-CASCADED ANALOG TO DIGITAL CONNECTOR

BACKGROUND OF THE INVENTION

1. Field of the Invention

This invention relates to analog to digital converters and, more particularly, to an ultra high speed, parallel-cascaded A/D converter.

2. State of the Prior Art

Parallel-cascaded A/D converters as generally provided heretofore in the prior art typically have required the use of linear amplifiers to effect the interconnection. The use of linear amplifiers for this purpose imposes requirements which are undesirable in view of complexity of implementing such devices and cost. Linear amplifiers as well restrict the speed of operation and are susceptible to variations in temperature and other operating conditions resulting in reduced reliability and accuracy.

Inasmuch as modern signal handling systems, including sensors and processors, require faster and more complex data processing, in turn implying conversion of the data to digital form to gain well recognized basic advantages of digital data processing, the ability to effect A/D conversion of the data at higher and higher speeds is of utmost importance. There is thus a continuing need for improved techniques of A/D conversion and specifically to achieve higher speeds of conversion at greater reliability in systems of reduced cost and complexity.

SUMMARY OF THE INVENTION

In accordance with the invention, an ultra high speed, parallel-cascaded A/D converter is implemented by a novel cascade interconnection of parallel A/D converters. A non-saturating high speed current switch is provided for each output bit of a first A/D converter. The current switches are connected in parallel to a summer, which may comprise a junction connected to a reference (ground) potential through a resistor, the junction thus operating as a summing point. The reference voltage levels are supplied to the comparators of the second A/D converter through a resistor divider network energized from a constant current source, the network further being connected to the summing junction. The logical values of the bit outputs of the first A/D converter determine the conducting states of the respective current switches which, when rendered conductive, sink corresponding current levels from the common junction. The voltage level at the summing junction thereby is varied as a function of the bit value outputs of the first A/D converter, and correspondingly adjusts the range of reference voltages supplied to the second A/D converter. The analog signal to be converted is applied in parallel to the two A/D converters and the bit outputs of the two converters in combination define the final digital output of the system.

In general two or more "N" bit parallel A/D converter networks may thereby be interconnected to yield a (2) × ("N") bit ultra high speed A/D converter. Operation at word rates in the 50 to 200 MHz range with high resolution is thereby achieved.

DETAILED DESCRIPTION OF THE INVENTION

In accordance with the invention, the high speed analog to digital converter includes first and second parallel-cascaded A/D converters. The cascaded interconnection is afforded through high speed current switches cooperating with a current summer connected to the second, parallel-cascaded A/D converter, the latter being energized from a constant current source. As above noted, the cascaded interconnection afforded by the invention eliminates the need for high speed linear amplifiers as required in typical prior art parallel-cascaded converters.

Figures 1, 5:
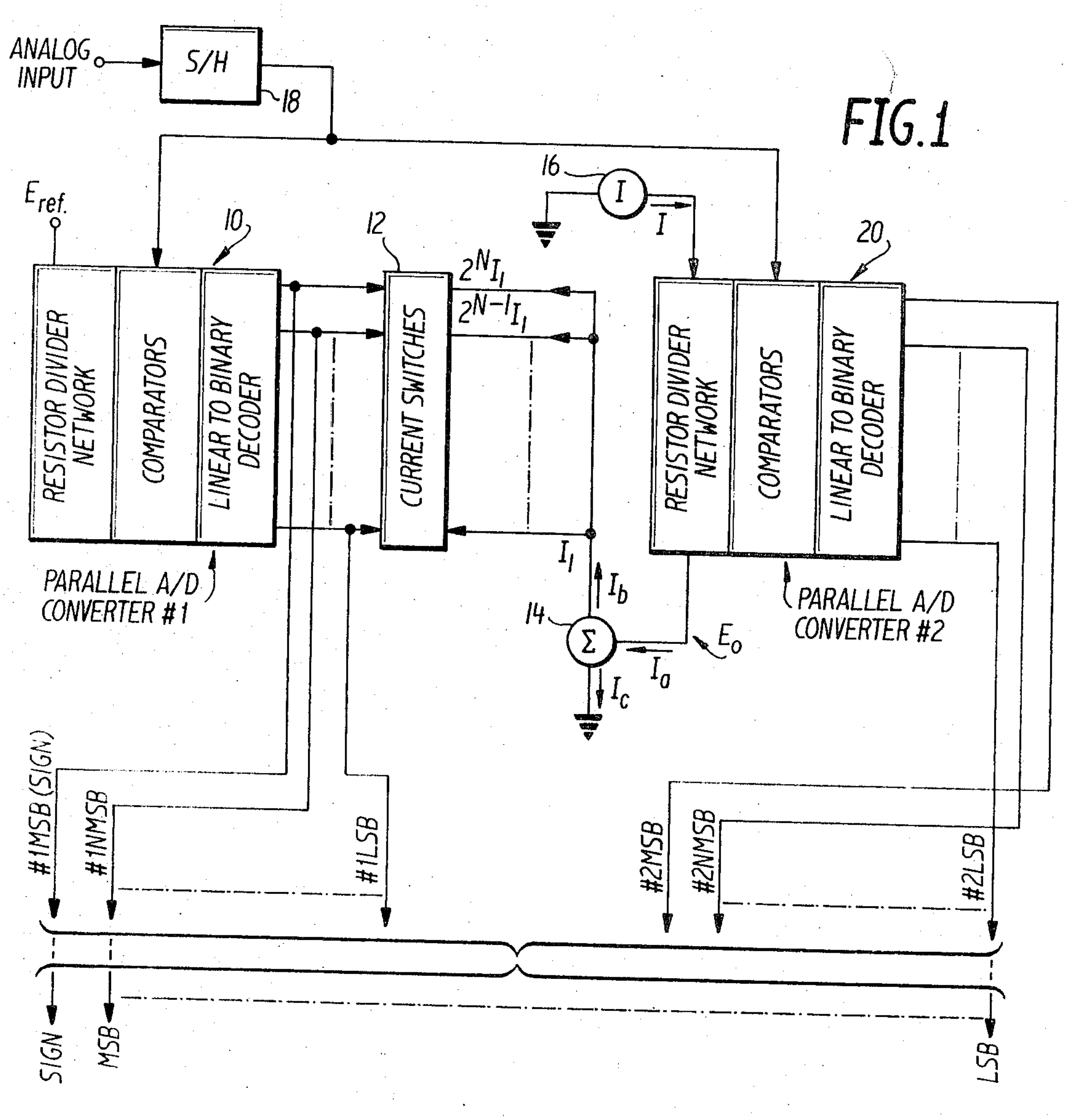
FIG. 1 illustrates in block diagram form the general arrangement of the parallel-cascaded A/D converter of the invention.
FIG. 5 is a table setting forth illustrative reference voltage values for corresponding 3 bit digital values of the first A/D converter for explaining the operation of the parallel-cascaded A/D converter of the invention.

The general arrangement of the converter of the invention is shown in FIG. 1. The parallel A/D converter No. 1 is shown generally at 10 and the A/D converter No. 2 is shown at 20. Each includes, illustratively, a resistor divider network and corresponding comparators of a number related to the number of bits processed by each, with a linear to binary decoder providing the final binary bit value outputs. The resistor divider network of the parallel-cascaded A/D converter No. 2 is energized from a constant current source 16, and produces a current flow $I_a$. A system of current switches 12, individually responsive to the binary outputs of the parallel A/D converter No. 1, operate as current sinks, in accordance with the value of the related bit, and produce a composite current flow $I_b$. Current flows $I_a$ and $I_b$ are summed in summer 14, which furthermore includes a connection to ground, or reference potential, carrying the current flow $I_c$. The currents are related such that $I_a = I_b + I_c$. Summer 14 includes resistance means whereby the reference voltage $E_0$ supplied to the resistor divider network of A/D converter No. 2 is adjusted as a function of the respective current flows $I_a$, $I_b$ and $I_c$.

In a practical embodiment, a sample and hold circuit 18 receives the analog input signal to provide a sampled analog level in parallel to each of the A/D converters No. 1 and No. 2.

For ease of reference, the parallel binary bit outputs from A/D converter No. 1 are labelled in FIG. 1 as No. 1 MSB (sign), No. 1 NMSB . . . No. 1 LSB. Similarly, the outputs from A/D converter No. 2 are labelled No. 2 MSB, No. 2 NMSB . . . No. 2 LSB. These notations bear their conventional significance of MSB signifying most significant bit, NMSB signifying next most significant bit and LSB signifying least significant bit. As is made more apparent hereafter, the No. 1 MSB (sign) output of A/D converter No. 1 affords the sign output of the final binary output from the parallel-cascaded A/D converter. Similarly No. 1 NMSB becomes the MSB of the final output and finally No. 2 LSB becomes the LSB of the final output.

A specific embodiment of the parallel-cascaded A/D converter of the invention is disclosed herein as a 6 bit A/D converter. As explained in detail hereafter, the parallel A/D converter No. 1 and No. 2 each processes 3 bits, A/D converter No. 1 providing the sign and two data bits and A/D converter No. 2 providing three further data bits.

Figures 2, 3:
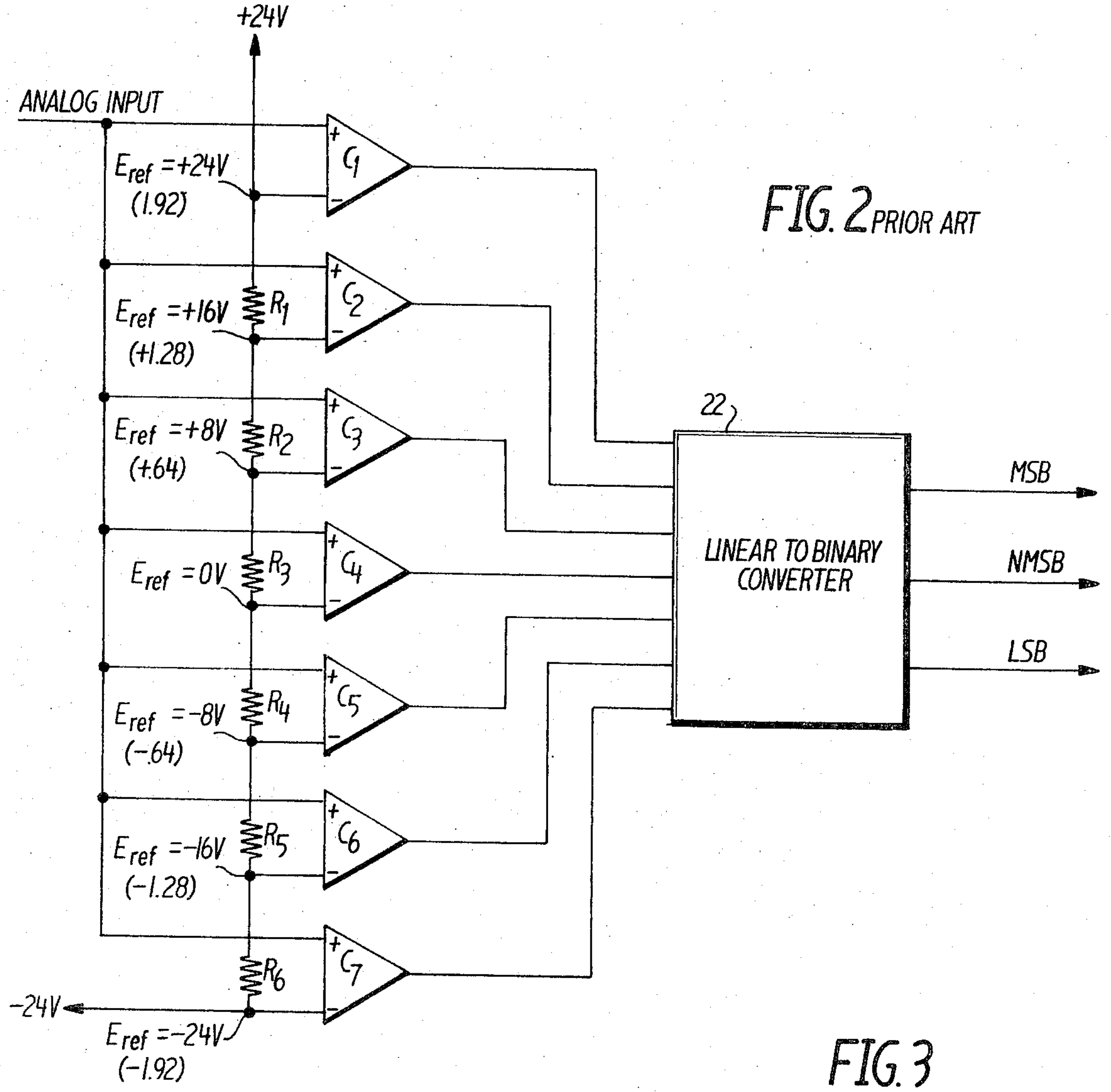
FIG. 2 PRIOR ART
FIG. 2 illustrates in block diagram form a prior art, 3 bit parallel A/D converter.
FIG. 3 is a truth table of representative analog input values, linear digital values, and 3 bit binary values for the 3 bit parallel A/D converter of FIG. 2.

In FIG. 2 is shown a 3 bit parallel A/D converter, for purposes of simplifying the explanation of the concepts involved in the parallel-cascaded converters of the invention. Herein, the analog input which may again be processed through a sample and hold circuit (not shown) is applied in parallel to the non-inverting-inputs of seven comparators $C_1$ through $C_7$.

In general, as is well known, an N bit A/D converter can discriminate $2^N$ levels of an input signal. In the illustrative converter of FIG. 2, a 3 bit converter comprising 2 bits plus a sign bit is illustrated. Accordingly, N = 2. To further simplify the explanation, it is assumed that the analog input voltage range is ± 32 volts. Accordingly, the ability to discriminate $2^N$ levels where N = 2, implies a discrimination level of the LSB of a corresponding analog value of:

$$LSB = 32/2^2 = 32/4 = 8 \text{ volts} \quad (1)$$

Reference voltages are applied to the inverting inputs of comparators $C_1$ through $C_7$ of values corresponding to the discrimination levels afforded by the converter. It follows that an 8 volt differential must exist between the inverting inputs to adjacent comparators and thus, for example, the reference voltage $E_{Ref}$ applied to the non-inverting-input of comparator $C_1$ is 24 volts, and that applied to the inverting input of comparator $C_2$ is 16 volts, implying an 8 volt voltage drop across resistor $R_1$.

The resistors $R_1$ through $R_6$ of the resistor divider network thus provide the aforediscussed reference voltage levels to the inverting inputs of the comparators $C_1$ through $C_7$ such that each comparator has a reference voltage on its inverting input which is equal to one LSB greater than the comparator below it. For the disclosed system of FIG. 2, this alternatively may be expressed that comparator $C_1$ receives a reference voltage of three LSB's, $C_2$ receives a reference voltage of two LSB's . . . and comparator $C_7$ receives a reference voltage of −3 LSB's or −24 volts, as shown. Further, each comparator produces as its output, a logical 1 if the non-inverting input (i.e., the analog input) is greater than the inverting input and a logical 0 if the non-inverting-input (i.e., the analog input) is less than the inverting input. (The numbers including decimal values indicated in parentheses in FIG. 2 are explained hereinafter).

By way of example, if the analog input to be converted lies within the range of 8 to 16 volts, comparators $C_1$ and $C_2$ produce logical 0 outputs whereas each of comparators $C_3$ through $C_7$ produces a logical 1 output. The linear to binary converter 22, which may comprise known arrangements of logic gates, converts the seven comparator outputs of $C_1$ through $C_7$ to a 3 bit binary output. A truth table for the linear to binary converter 22 for processing eight analog, or linear inputs and producing three bit binary outputs, as discussed, is shown in FIG. 3.

Figure 4:
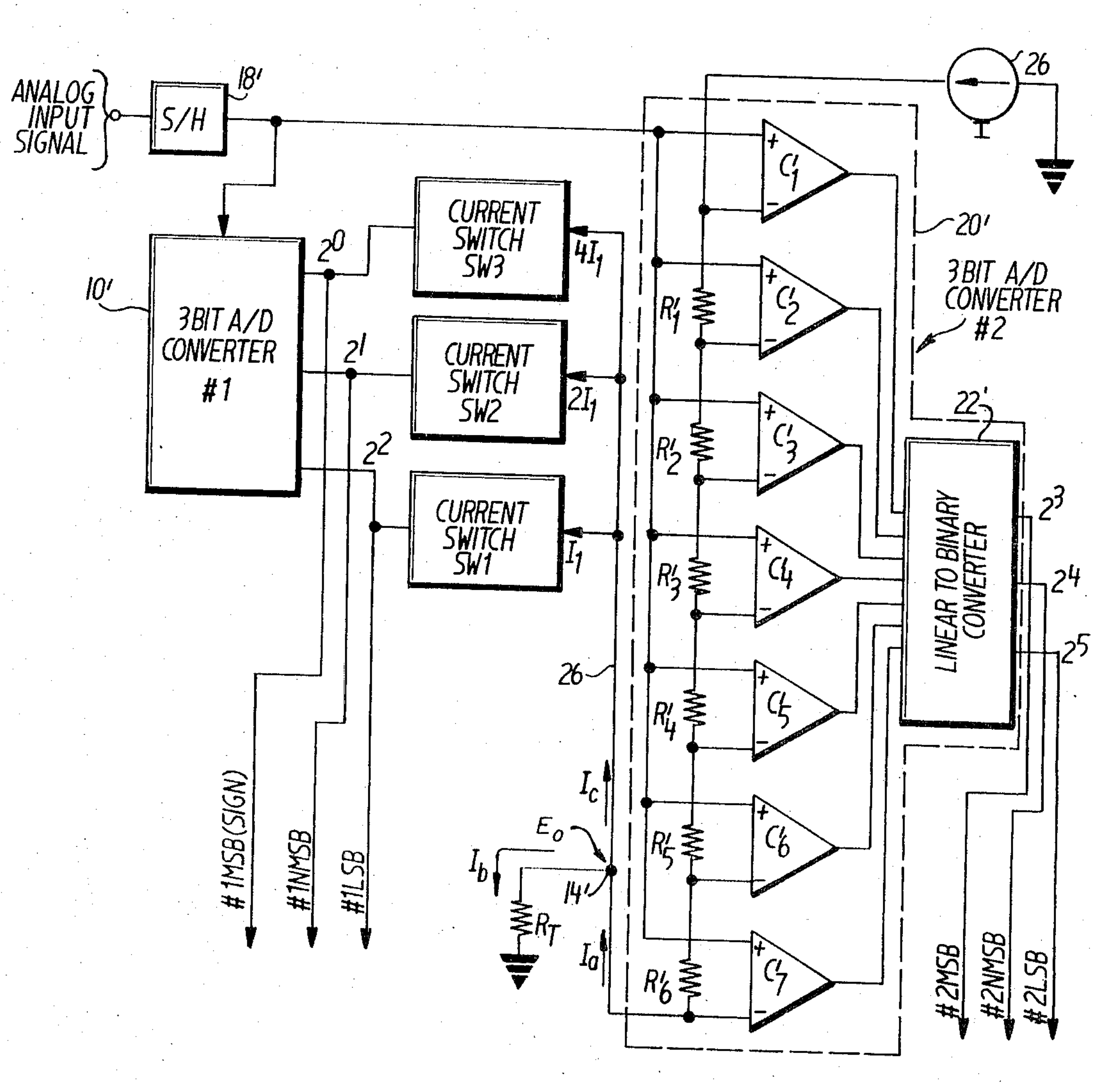
FIG. 4 is a detailed block diagram of the parallel-cascaded A/D converter of the invention in an illustrative embodiment providing a sign bit and 5 digit bits from least to most significant for the converted A/D output.

A high speed, parallel-cascaded A/D converter in accordance with the invention is shown in FIG. 4. The 3 bit A/D converter No. 1 identified at 10' corresponds to the converter No. 1 shown at 10 in FIG. 1 and specifically may be identical in construction to the three (3) bit converter of FIG. 2. The parallel A/D converter No. 2 shown within the dotted box labelled 20' in FIG. 4 corresponds to the A/D converter No. 2 in FIG. 1 and, upon examination, will be seen to be identical in its internal configuration to that of the 3 bit A/D converter No. 1, as shown illustratively in FIG. 2. The resistor divider network of A/D converter 20' comprises resistors $R_1$ through $R_6$ and the comparators are identified as $C'_1$ through $C'_7$. A linear to binary converter 22' similarly is provided.

A constant current generator 26 supplies energizing current to the resistor divider network $R'_1$ through $R'_6$; the divider is connected to a summing point, or junction, labelled 14' to indicate its correspondence to the summer 14 in FIG. 1, and through a resistor of value $R_T$, as labelled, to ground or reference potential. The voltage $E_0$ is developed across resistor $R_T$ and thus is established at the junction 14', as described in more detail hereafter. The analog input signal, provided through sample and hold circuit 18' to the A/D converter No. 1, also is provided to A/D No. 2 converter, and specifically to the non-inverting inputs of each of the comparators $C'_1$ through $C'_7$.

The summing junction 14' of the resistor divider network and the resistor $R_T$ is connected through lead 26 in parallel to current switches SW1, SW2 and SW3. The current switches SW1 through SW3 are controlled in position by the values of corresponding bit outputs of A/D converter No. 1. If No. 1 LSB is a logical 0, switch SW1 sinks a current $I_1$ through link 26 and thus produces a first effect on the current $I_b$, and correspondingly on voltage $E_0$ at junction 14'. If No. 1 LSB is a logical 1, switch SW1 sinks zero current. In a similar manner, switch SW2 will sink a current $2I_1$ and switch SW3 will sink a current $4I_1$ in response to logical 0 inputs for No. 1 NMSB and No. 1 MSB, respectively, and zero current for logical 1 inputs, with corresponding changes in the current $I_b$ and thus the voltage $E_0$.

In FIG. 5 is shown a table presenting the desired output voltage $E_0$ produced at junction 14' for every combination of bit value inputs No. 1 MSB, No. 1 NMSB and No. 1 LSB from the 3 bit A/D converter No. 1. As later described, the resistance value of summing resistor $R_T$, the sink current $I_1$, and the constant current I of constant current generator 26 are selected to yield the results shown in the table of FIG. 5.

The value resistance R' (i.e., the resistance value of each of resistors $R'_1$ through $R'_6$) is chosen such that $$IR' = 1\ LSB \quad (2)$$

As before discussed, the illustrative embodiment of the system of the invention provides a 5 bit discrimination level, i.e., N = 5 and one sign bit. The value of ±32 volts assumed for the range of the analog input correspondingly defines the value of the LSB for A/D converter No. 2 as follows:

$$\text{No. 2 LSB} = 32/2^N = 32/2^5 = 1\ \text{volt} \quad (3)$$

Thus, the resistor value R′ is chosen in relation to the constant current I to provide a one volt voltage differential at the inverting inputs of the comparators $C'_1$ through $C'_7$.

Figure 6:
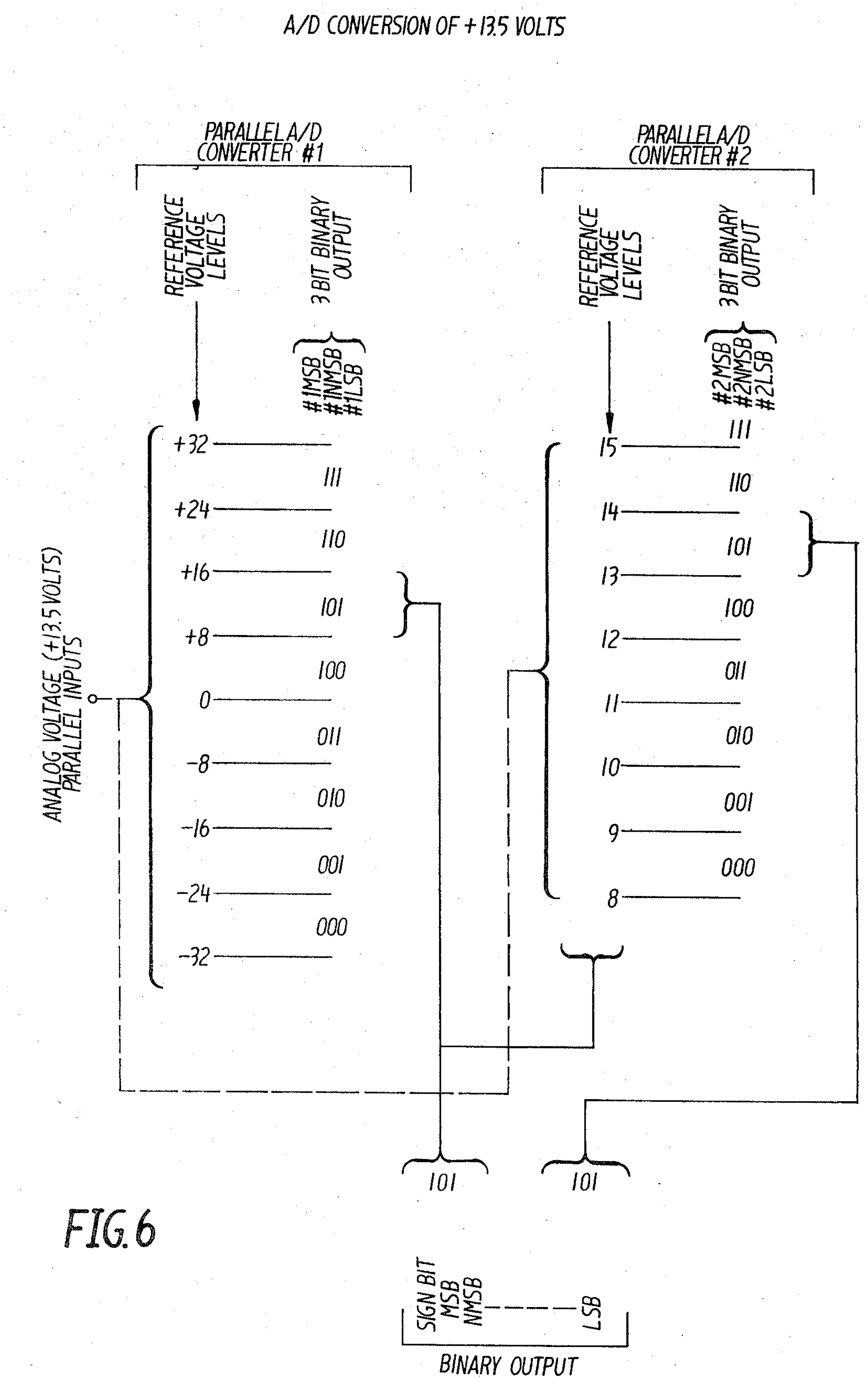
FIG. 6 is a further table setting forth reference voltage levels and corresponding binary outputs to assist in explaining the conversion of an illustrative, specific analog voltage to a corresponding digital value by a parallel-cascaded analog to digital converter in accordance with the invention.

A more precise calculation of the values of the elements is set forth below. However, it is instructive first to understand the mechanization of the 6 bit A/D converter of FIG. 4 in accordance with the values set forth in the table of FIG. 5. For this purpose, there is shown in the table of FIG. 6 the values obtaining in an A/D conversion of an analog input voltage of +13.5 volts. On the left side of FIG. 6 are illustrated the analog input voltage ranges and the corresponding 3 bit binary outputs of A/D converter No. 1 as those values are defined in the table of FIG. 3. Thus, a +13.5 volt analog input will result in the binary 3 bit output 101 from A/D converter No. 1.

Noting from the table of FIG. 5 that where each of No. 1 MSB, No. 1 NMSB and No. 1 LSB are logical 1 and thus the corresponding currents $I_1$, $2I_1$ and $4I_1$ are zero, $E_0$ has a value of +25 volts. However, for the illustration, where the bit values are 101, $E_0$ is now +9 volts. The range of voltages presented to the comparators $C'_1$ through $C'_7$ of A/D converter No. 2 thus are shifted by the corresponding shift in the voltage $E_0$ to the range as indicated in the right side of the table of FIG. 6. Specifically, $E_0$ = +9 volts is the reference voltage supplied to the inverting input of comparator $C'_7$, 10 volts is the reference voltage supplied to the inverting input of comparator $C'_6$ . . . and 15 volts is the reference voltage supplied to the inverting input of comparator $C'_1$.

The value of +13.5 volts of the analog input thus produces a logic 1 output from each of comparators $C'_3$ through $C'_7$ which is decoded by the linear to binary converter 22′ to output the binary value 101. The total binary output of the parallel-cascaded converter thus is 101 101 for the sign bit, and the five data bits of the MSB through the LSB. The sign bit, inasmuch as a positive voltage of +13.5 volts is proposed as the analog input, typically is logical 1 to indicate the positive sign.

By way of further clarification, as before noted, $E_0$ is adjusted in its value by the summer operation $I_a = I_b + I_c$, and thus as a function of the 3 bit outputs of A/D converter No. 1. Any change in $E_0$ produces a corresponding change in the range of reference voltage levels supplied to the inverting inputs of the comparators $C'_1$ through $C'_7$. The voltage drop of one volt for each of $R'_1$ through $R'_6$ presents a total of six volts through the resistor divider network of A/D converter No. 2.

In relation to FIG. 5, therefore, the absolute voltage levels presented at the comparator inverting inputs of A/D converter No. 2 have a range of maximum levels, for the condition wherein the A/D converter No. 1 output is 111. For this condition, none of the switches SW1 2 or 3 is conducting. The voltage levels therefore range from 26 to 31 volts, in one-volt increments, viz:

for comparator $C'_1$, $E_0 + I \cdot 6R' = 25 + 6 = $ 31 volts,

. . .

for comparator $C'_6$, $E_0 + I \cdot IR' = 25 + 1 = $ 26 volts and, for comparator $C'_7$, $E_0$ = +25 volts.

A minimum, or lower range, is defined by the A/D converter No. 1 output of 000, wherein all of switches SW1, 2 and 3 are conducting. The voltage levels for this condition range from −25 to −19 volts, again in one-volt increments, viz:

for comparator $C'_1$, $E_0 + I \cdot 6R' = 31 + 6 = -25$ volts,

. . .

for comparator $C'_6$, $E_0 + I \cdot IR' = -31 + 1 + -30$ volts, and for comparator $C'_7$, $E_0 = -31$ volts.

This then encompasses the total range of the analog input of ± 24 volts as adopted for this illustration.

Note, as well, in FIG. 4 that the labelling of the binary outputs of A/D converter No. 1 of $\mathbf{2^0}$, $\mathbf{2^1}$, and $\mathbf{2^2}$ and of A/D converter No. 2 of $\mathbf{2^3}$, $\mathbf{2^4}$ and $\mathbf{2^5}$ designates the discrimination levels represented by the corresponding output bits, and not the significance of the respective bit positions in the final digital output.

Considering now the current and resistor values for the illustrative 6 bit system of FIG. 4, and again for the assumed analog voltage range of ±32 volts, the following calculations obtain. From FIG. 6, $E_0$ = +25 volts for the 3 bit input 111. Each of $I_1$, $2I_1$ and $4I_1$ is therefore zero. The following expression then obtains:

$$E_0 = IR_T = 25\ \text{volts} \quad (4)$$

Letting E′ = IR′ = 1 LSB = 1 volt as previously established, and letting R′ = 3.9 ohms:

$$I = E'/R' = 1.0/3.9\ \text{amps} \quad (5)$$

Further, from equation (4), $R_T = 25/I = 25 \times 3.9 = 97.5$ ohms.

Further, for an input bit pattern of 110 from the table of FIG. 5, $E_0$ = +17 volts, and the following expressions obtain:

$$(I - I_1)\,R_T = +17$$
$$I - I_1 = 17/\mathbf{97.5}$$
$$I_1 = 8/\mathbf{97.5}\ \text{amps} \quad (6)$$

Thus, switch SW2 will sink 16/97.5 amps when its input is a logical zero and switch SW1 will sink 32/97.5 amps when its input is a logical zero. It may readily be shown that, when all three logical inputs are zero, $E_0 = -31$ volts:

$$(I - 7I_1)R_T = (1/3.9 - 7 \times 8/\mathbf{97.5})\ 97.5 = -31\ \text{volts} \quad (7)$$

The foregoing illustration of the system of the invention has proceeded on assumed values of the analog input levels to permit simplification of the calculations on the normalized basis that 1 LSB = 1 volt. As a more practical value, 1 LSB = 80 MV. Thus, all of the foregoing current and voltages values, whether assumed and/or calculated above from those assumed values, would be divided by 12.5. Thus, for example, currents I and $I_1$ become, respectively 20.5 ma and 6.56 ma. The decimal values shown in parenthesis in FIG. 2, mentioned above, represent practical reference voltage levels as would be provided to the comparators of A/D converter No. 1, the analog equivalent value of 1 LSB being 0.64 volts. Correspondingly decreased reference voltage levels then are provided to the comparators of A/D converter No. 2.

The converter of the invention specifically disclosed above to provide a 6 bit converter output may be modified to provide any desired number of output bits. In general, the invention permits interconnection of two or more N bit parallel A/D converters to yield a (2) × (N) bit ultra high speed A/D converter. A high resolution, high speed A/D conveter with word rates in the 50 to 200 MHz range may be readily achieved in accordance with the invention.

Since the converter of the invention may be implemented largely with integrated circuits, it may be of very small size. Linear amplifiers as required in prior art parallel-cascaded converters are eliminated in the present design and instead a constant current source and non-saturating current switches are employed, the latter being far more readily controllable than are linear amplifiers and having a much reduced settling time interval, in the range of one microsecond. The system exhibits long term stability as well as excellent temperature stability inasmuch as the constant current source and the non-saturating current switches tend to track and afford self-compensation for temperature variations.

Numerous modifications and adaptations of the system of the invention will be apparent to those skilled in the art and thus it is intended by the appended claims to cover all such modifications and adaptations which fall within the true spirit and scope of the invention.

What is claimed is:

1. A parallel-cascaded analog to digital converter for converting an analog input signal to a 2N bit digital output signal, comprising:

a first parallel analog to digital converter receiving and converting the analog input signal to a first N bit digital output signal comprising the more significant bits of the 2N bit digital output signal, a summer, a constant current source, a second parallel analog to digital converter receiving and converting the analog input signal to a second N bit digital output signal comprising the lesser significant bits of the 2N bit digital output signal, said second analog to digital converter including reference voltage level establishing means connected in circuit with said summer means and energized by said constant current source for establishing a range of reference voltage levels.

current switching means connected in circuit with said summer and responsive to the first N bit output signal to control the current flow in said summer for selectively establishing voltages of predetermined levels across said summer said voltages of predetermined levels, respectively corresponding to the bit values of the first N bit output signal, and correspondingly selectively varying the range of reference voltage levels established by said reference voltage establishing means.

2. A parallel-cascaded analog to digital converter as recited in claim 1, wherein said summer comprises a resistor.

3. A parallel-cascaded analog to digital converter as recited in claim 1, wherein said reference voltage level establishing means comprises a resistor divider network.

4. A parallel-cascaded analog to digital converter as recited in claim 3, wherein:

said resistor divider network is connected in series with said summer resistor, and said current switching means is connected to the series connection of said resistor divider network and said summer resistor.

5. A parallel-cascaded analog to digital converter as recited in claim 4, wherein there are provided:

N current switching means respectively receiving corresponding ones of the first N bit digital outputs, and said N current switching means are connected in parallel to said series connection of said resistor divider network and said summer resistor.

6. A parallel-cascaded analog to digital converter as recited in claim 5, wherein said current switching means, from the least to the most significant bit of the first N bit digital outputs, respectively conduct a current $2^n I$ where $n = 0, 1, \ldots N$.

7. A parallel-cascaded analog to digital converter as recited in claim 6, wherein said constant current source provides a current I, said summer resistor has a resistance $R_T$ and the voltage $E_0$ across the summer resistor is defined by:

$$E_0=\left(I-\sum_{0}^{N} 2^n I_1\right)R_T$$

wherein the term $$\sum_{0}^{N} 2^n I_1$$

is the sum of the current conducted by the conducting ones of the current switches for any given first N bit digital output of said first analog to digital converter.

8. A parallel-cascaded analog to digital converter as recited in claim 4, wherein successive reference voltage levels established by said resistor divider network differ by the analog voltage equivalent of the least significant bit output of the second analog to digital converter.

9. A parallel-cascaded analog to digital converter for converting an analog input signal to a 2N bit digital output signal, comprising:

a first parallel analog to digital converter receiving and converting the analog input signal to a first N bit digital output signal comprising the more significant bits of the 2N bit digital output signal, a summer, a constant current source, a second parallel analog to digital converter receiving and converting the analog input signal to a second bit digital output signal comprising the lesser significant bits of the 2N bit digital output signal, said second analog to digital converter including reference voltage level establishing means connected in circuit with said summer means and said constant current source to be energized thereby for establishing 2N reference voltage levels differing in value by the equivalent analog value of the least significant bit output of the second analog to digital converter over a first range set by the voltage drop through said summer in response to the constant current, N current switching means receiving corresponding ones of the N bit outputs of said first analog to digital converter and being individually switched to a conducting or a non-conducting state in accordance with the values of the respective bits, and said N switching means being connected in parallel to said summer and being independently operative in the conducting states thereof as current sinks for selectively conducting currents of corresponding, predetermined magnitudes through said summer and producing corresponding, predetermined voltage drops across said summer for setting corresponding, different ranges of reference voltage levels.

10. A parallel-cascaded analog to digital converter as recited in claim 9, wherein said current switching means, from the least to the most significant bit of the first N digital outputs, respectively conduct a current $2^n I$ where $n = 0, 1, \ldots N$.

11. A parallel-cascaded analog to digital converter as recited in claim 10, wherein said constant current source provides a current I, said summer resistor has a resistance $R_T$ and the voltage $E_0$ across the summer resistor is defined by:

$$E_0=\left(I-\sum_0^N 2^n I_1\right)R_T$$

wherein the term $$\sum_0^N 2^n I_1$$

is the sum of the current conducted by the conducting ones of the current switches for any given first N bit digital output of said first analog to digital converter.

* * * * *